US006586781B2

(12) United States Patent
Wu et al.

(10) Patent No.: US 6,586,781 B2
(45) Date of Patent: Jul. 1, 2003

(54) GROUP III NITRIDE BASED FETS AND HEMTS WITH REDUCED TRAPPING AND METHOD FOR PRODUCING THE SAME

(75) Inventors: Yifeng Wu, Goleta, CA (US); Naiqing Zhang, Goleta, CA (US); Jian Xu, Thousand Oaks, CA (US); Lee Mc Carthy, Chapel Hill, NC (US)

(73) Assignees: Cree Lighting Company, Goleta, CA (US); The Regents of the University of California, Oakland, CA (US)

( * ) Notice: Subject to any disclaimer, the term of this patent is extended or adjusted under 35 U.S.C. 154(b) by 110 days.

(21) Appl. No.: 09/771,800

(22) Filed: Jan. 29, 2001

(65) Prior Publication Data

US 2001/0023964 A1 Sep. 27, 2001

Related U.S. Application Data

(60) Provisional application No. 60/180,435, filed on Feb. 4, 2000.

(51) Int. Cl.$^7$ .............................................. H01L 29/778
(52) U.S. Cl. ...................... 257/194; 257/192; 257/195; 257/94; 257/96; 257/411; 257/410; 257/368
(58) Field of Search .................... 257/368, 194, 257/192, 195, 410, 411, 94, 96; 438/197, 183, 184, 162, 167

(56) References Cited

U.S. PATENT DOCUMENTS

| | | | | |
|---|---|---|---|---|
| 4,477,311 A | * | 10/1984 | Mimura et al. | 156/643 |
| 5,929,467 A | * | 7/1999 | Kawai et al. | 257/192 |
| 5,933,705 A | | 8/1999 | Geels et al. | 438/26 |
| 6,064,082 A | * | 5/2000 | Kawai et al. | 257/192 |
| 6,072,203 A | * | 6/2000 | Nozaki et al. | 257/194 |
| 6,140,169 A | * | 10/2000 | Kawai et al. | 438/197 |
| 6,177,685 B1 | * | 1/2001 | Teraguchi et al. | 257/20 |
| 6,261,859 B1 | * | 7/2001 | Ouchi | 438/39 |
| 6,316,793 B1 | * | 11/2001 | Sheppard et al. | 257/103 |
| 6,316,820 B1 | | 11/2001 | Schmitz et al. | 257/649 |
| 6,426,264 B1 | * | 7/2002 | Kawai | 438/311 |

FOREIGN PATENT DOCUMENTS

WO   WO0113436 A1   2/2001

OTHER PUBLICATIONS

Yi–Jen Chan et al. *GAO.51 INO.49P/GAAS HENT's Exhibiting Good Electrical Performance at Cryogenic Temperatures* IEEE Transactions on Electron Devices, US, IEEE Inc., New York, vol. 37, No. 10, Oct. 1990, pp. 2141–2147.

Vetter M. *Surface Passivation of Silicon by RF Magnetron–Sputtered Silicon Nitride Films* vol. 337, No. 1–2, Jan. 1999, pp. 118–122.

Vetter M. et al., *Properties of Amorphous Si–Rich Silicon Nitride Prepared by RF–Magnetron Sputtering* Feb. 2000, vol. 71, No. 1–3 Materials of Science and Engineering.

(List continued on next page.)

*Primary Examiner*—Nathan J. Flynn
*Assistant Examiner*—Fazli Erdem
(74) *Attorney, Agent, or Firm*—Koppel, Jacobs, Patrick & Heybl

(57) ABSTRACT

New Group III nitride based field effect transistors and high electron mobility transistors are disclosed that provide enhanced high frequency response characteristics. The preferred transistors are made from GaN/AlGaN and have a dielectric layer on the surface of their conductive channels. The dielectric layer has a high percentage of donor electrons that neutralize traps in the conductive channel such that the traps cannot slow the high frequency response of the transistors. A new method of manufacturing the transistors is also disclosed, with the new method using sputtering to deposit the dielectric layer.

41 Claims, 6 Drawing Sheets

OTHER PUBLICATIONS

Kojima I et al. *X–ray Photoelectron Spectroscopy and Grazing Incidence X–ray Reflectivity Study of Silicon Nitride Thin Films*, vol. 334, No. 1–2 Thin Solid Films 334 (1998).

Nietubyc R, et al. *Electronic Structure of Silicon Nitride* vol. 286, No. 1–2, 1999, pp. 148–152.

Chen Q., et al. *Microwave Electronics Device Applications of AlGaN/GaN Heterostructures* Materials Science & Engineering vol. 59, No. 1–3, 1999, pp. 395–400.

Lai R, et al. *A High–Efficiency 94–GHZ 0.15–MUM InGaAs/InA1A1As/InP Monolithic Power HEMT Amplifier* IEEE Microwave and Guided Wave Letters, vol. 6, No. 10, 1996, pp. 366–368.

Nguyen N X, et al. *GAN/ALGAN MODFET with 80GHZ FMAX and >100V Gate–Drain Breakdown Voltage* Electronics Letters, vol. 33, No. 4, 1997, pp. 334–335.

* cited by examiner ns, but with freq# GROUP III NITRIDE BASED FETS AND HEMTS WITH REDUCED TRAPPING AND METHOD FOR PRODUCING THE SAME This application claims the benefit of provisional application Ser. No. 60/180,435 to Wu et al., that was filed on Feb. 4, 2000.

This invention was made with Government support under Contract No. N00014-99-M-0148, awarded by the ONR. The Government has certain rights in this invention.

BACKGROUND OF THE INVENTION

1. Field of the Invention

This invention relates to high frequency solid state transistors, and more particularly to Group III nitride based field effect transistors and high electron mobility transistors.

2. Description of the Related Art

Microwave systems commonly use solid state transistors as amplifiers and oscillators which has resulted in significantly reduced system size and increased reliability. To accommodate the expanding number of microwave systems, there is an interest in increasing their operating frequency and power. Higher frequency signals can carry more information (bandwidth), allow for smaller antennas with very high gain, and provide radar with improved resolution.

Field effect transistors (FETs) and high electron mobility transistors (HEMTs) are common types of solid state transistors that are fabricated from semiconductor materials such as Silicon (Si) or Gallium Arsenide (GaAs). One disadvantage of Si is that it has low electron mobility (approximately 1450 cm$^2$/V-s), which produces a high source resistance. This resistance seriously degrades the high performance gain otherwise possible from Si based FETs and HEMTs. [CRC Press, *The Electrical Engineering Handbook*, Second Edition, Dorf, p.994, (1997)]

GaAs is also a common material for use in FETs and HEMTs and has become the standard for signal amplification in civil and military radar, handset cellular, and satellite communications. GaAs has a higher electron mobility (approximately 6000 cm$^2$/V-s) and a lower source resistance than Si, which allows GaAs based devices to function at higher frequencies. However, GaAs has a relatively small bandgap (1.42 eV at room temperature) and relatively small breakdown voltage, which prevents GaAs based FETs and HEMTs from providing high power at high frequencies.

Improvements in the manufacturing of GaN/AlGaN semiconductor materials have focussed interest on the development of GaN/AlGaN based FETs and HEMTs. These devices can generate large amounts of power because of their unique combination of material characteristics including high breakdown fields, wide bandgaps (3.36 eV for GaN at room temperature), large conduction band offset, and high saturated electron drift velocity. The same size GaN amplifier can produce up to ten times the power of a GaAs amplifier operating at the same frequency.

U.S. Pat. No. 5,192,987 to Khan et al discloses GaN/AlGaN based HEMTs grown on a buffer and a substrate, and a method for producing them. Other HEMTs have been described by Gaska et al., "High-Temperature Performance of AlGaN/GaN HFET's on SiC Substrates," *IEEE Electron Device Letters*, Vol. 18, No 10, October 1997, Page 492; and Ping et al., "DC and Microwave Performance of High Current AlGaN Heterostructure Field Effect Transistors Grown on P-type SiC Substrates," *IEEE Electron Devices Letters*, Vol. 19, No. 2, February 1998, Page 54. Some of these devices have shown a gain-bandwidth product (f$_T$) as high as 67 gigahertz (K. Chu et al. WOCSEMMAD, Monterey, Calif., February 1998) and high power densities up to 2.84 W/mm at 10 GHz (G. Sullivan et al., "High Power 10-GHz Operation of AlGaN HFET's in Insulating SiC," *IEEE Electron Device Letters*, Vol. 19, No. 6, June 1998, Page 198; and Wu et al., IEEE Electron Device Letters, Volume 19, No. 2, Page 50, February 1998.)

Despite these advances, GaN/AlGaN based FETs and HEMTs have been unable to produce significant amounts of total microwave power with high efficiency and high gain. They produce significant power gain with DC gate drives, but with frequency step-ups as low as a millihertz to a few kilohertz, their amplification drops off significantly.

It is believed that the difference between AC and DC amplification is primarily caused by surface traps in the device's channel. Although the nomenclature varies somewhat, it is common to refer to an impurity or defect center as a trapping center (or simply trap) if, after capture of one type carrier, the most probable next event is re-excitation. In general, trapping levels located deep in a band gap are slower in releasing trapped carriers than other levels located near the conduction of valence bands. This is due to the increased energy that is required to re-excite a trapped electron from a center near the middle of the band gap to the conduction band, compared to the energy required to re-excite the electron from a level closer to the conduction band.

Al$_x$Ga$_{1-x}$N (X=0~1) has a surface trap density comparable to the channel charge of the transistor with the traps in deep donor states with activation energy ranging from approximately 0.7 to 1.8 eV (depending on X). During FET and HEMT operation, the traps capture channel electrons. The slow trapping and de-trapping process degrades transistor speed, which largely degrades the power performance at microwave frequencies.

SUMMARY OF THE INVENTION

The present invention provides an improved Group III nitride based FETs and HEMTs that are preferably formed of GaN/AlGaN and exhibit improved amplification characteristics in response to AC gate drives. The invention also provides a new method for producing the new GaN/AlGaN FET and HEMT.

The new FET comprises a barrier layer on a high resistivity, non-conducting layer. Source, drain and gate contacts are included, with each contacting the barrier layer. A electron donor layer is formed on the surface of the barrier layer between the contacts, the donor layer preferably being a dielectric layer with a high percentage of donor electrons.

For the new HEMT, the barrier layer has a wider bandgap than the non-conducting layer and, as a result, a two dimensional electron gas (2DEG) forms at the junction between the barrier layer and the non-conducting layer. The 2DEG has a high concentration of electrons which provide an increased device transconductance. The new HEMT has contacts that are similar to those on the FET's conducting channel and a similar dielectric layer is included on the HEMT's conducting channel.

In each device, it is believed that the barrier layer has surface traps that are positively charged. It is also believed that the electron donor layer's donor electrons migrate to the device's barrier layer and fill the surface traps. This causes them to become neutral and prevents them from capturing free electrons. The new electron donor layer also increases sheet electron density in the un-gated regions of the devices and protects the devices from undesirable passivation, impurities and damage during handling.

The present invention also provides a method for producing the new GaN FET or HEMT. The new method relies on sputtering techniques and results in little to no damage to the surface of the conduction channel. It also provides a strong and stable bond between the dielectric layer and the surface of the channel.

These and other further features and advantages of the invention would be apparent to those skilled in the art from the following detailed description, taking together with the accompanying drawings, in which:

DETAILED DESCRIPTION OF THE INVENTION

New GaN/AlGaN FET and HEMT

Figure 1:
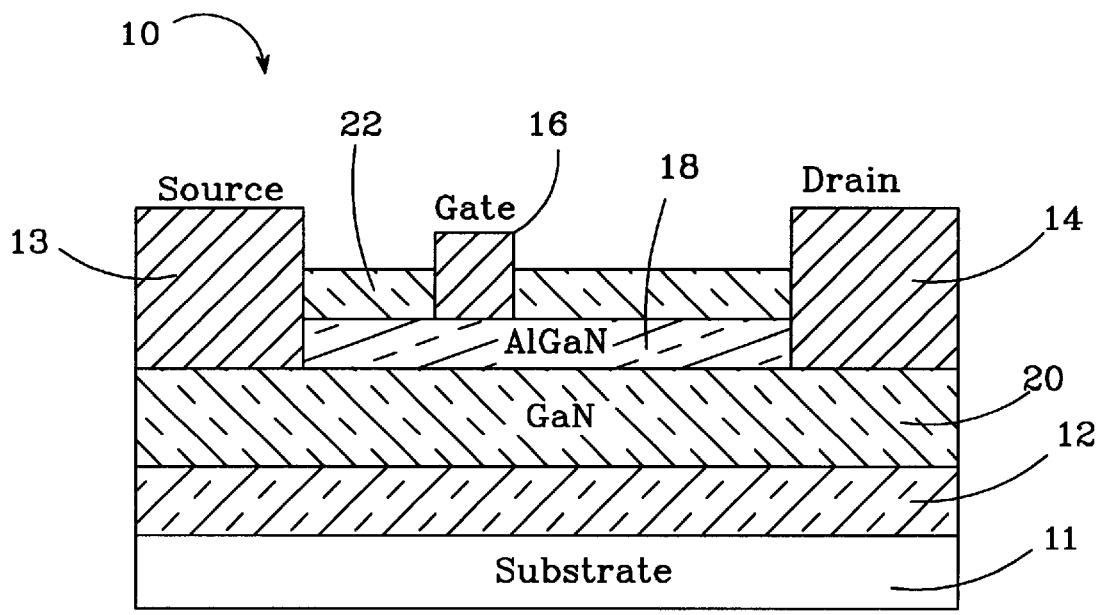
FIG. 1 is a sectional view of a new GaN/AlGaN FET with a dielectric layer on its surface.

FIG. 1 shows the new Group III nitride based FET 10 constructed in accordance with this invention. It comprises a substrate 11 that can be either sapphire ($Al_2O_3$) or silicon carbide (SiC), with the preferred substrate being a 4H polytype of silicon carbide. Other silicon carbide polytypes can also be used including 3C, 6H and 15R polytypes. An $Al_xGa_{1-x}N$ buffer layer 12 (where x in between 0 and 1) is included on the substrate 11 and provides an appropriate crystal structure transition between the silicon carbide substrate and the remainder of the FET 10.

Silicon carbide has a much closer crystal lattice match to Group III nitrides than sapphire and results in Group III nitride films of higher quality. Silicon carbide also has a very high thermal conductivity so that the total output power of Group III nitride devices on silicon carbide is not limited by the thermal dissipation of the substrate (as is the case with some devices formed on sapphire). Also, the availability of silicon carbide substrates provides the capacity for device isolation and reduced parasitic capacitance that make commercial devices possible. SiC substrates are available from Cree Research, Inc., of Durham, N.C. and methods for producing them are set forth in the scientific literature as well as in a U.S. Pat. No. Re. 34,861; U.S. Pat. Nos. 4,946,547; and 5,200,022.

Group III nitrides refer to those semiconductor compounds formed between nitrogen and the elements in Group III of the periodic table, usually aluminum (Al), gallium (Ga), and indium (In). The term also refers to ternary and tertiary compounds such as AlGaN and AlInGaN.

The FET 10 has a barrier layer 18 made of $Al_xGa_{1-x}N$, that is on a high resistivity, non-conducting layer 20 made of GaN. The high resistivity layer 20 is sandwiched between the barrier layer 18 and the buffer layer 12. The barrier layer is typically about 0.1 to 0.3 micrometers thick and the barrier layer 18, high resistivity layer 20, and buffer layer 12, are preferably formed on the substrate 11 by epitaxial growth or ion implantation.

The FET also has a source and a drain contact 13 and 14, that are on the surface of the high resistivity layer 20. The barrier layer 18 is disposed between the contacts 13 and 14, with each contacting the edge of the barrier layer 18. The contacts 13 and 14 are usually separated by a distance in the range 3 to 10 micrometers for microwave devices. A rectifying Schottky contact (gate) 16 is located on the surface of the barrier layer 18 between the source and drain contacts 13 and 14, and it typically has a length in the range of 0.1 to 2 micrometers. The total width of the FET depends on the total power required. It can be wider than 30 millimeters, with the typical width being in the range of 50 to 100 microns. The area of the channel's surface between the contacts is referred to as the channel's access region.

The source and drain contact 13 and 14, are preferably formed of alloys of titanium, aluminum, nickel and gold, and the gate 16 is preferably formed of titanium, platinum, chromium, nickel, alloys of titanium and tungsten, and platinum silicide. In one embodiment, the contacts comprise an alloy of nickel, silicon, and titanium that is formed by depositing respective layers of these materials, and then annealing them. Because this alloy system eliminates aluminum, it avoids unwanted aluminum contamination over the device surface when the anneal temperature exceeds the melting point of aluminum (660° C.).

During operation, the drain contact 14 is biased at a specified potential (positive drain potential for an n-channel device) and the source 13 is grounded. This causes current to flow through the channel, from the drain 14 to the source 13. The flow of current is controlled by the bias and frequency potentials applied to the gate 16, which modulate the channel current and provide gain.

Figure 2:
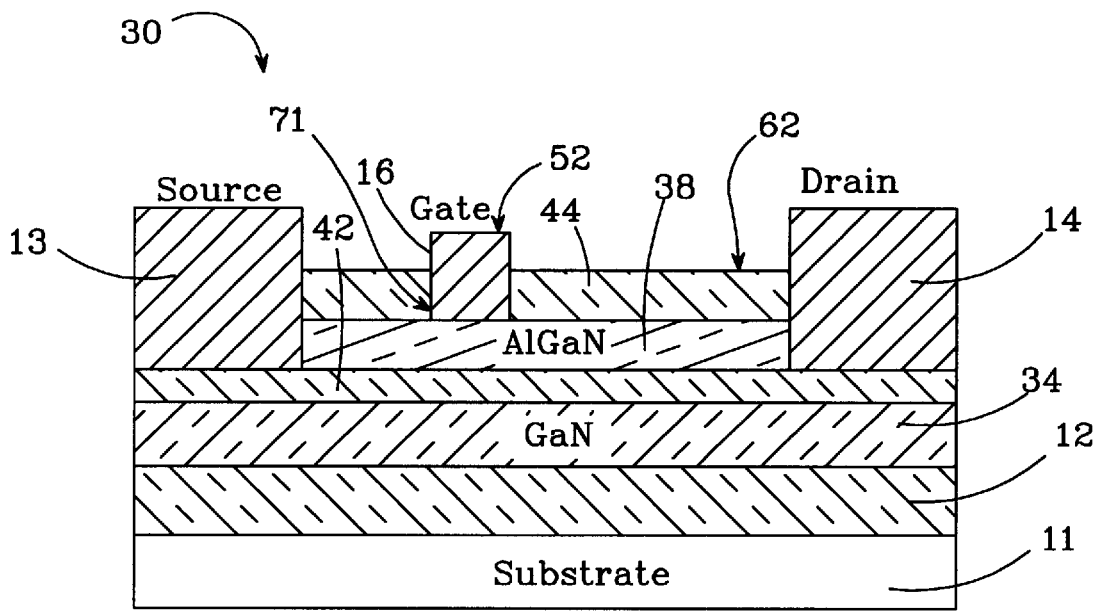
FIG. 2 is a sectional view of a new GaN/AlGaN HEMT with a dielectric layer on its surface.

The present invention is also applicable to GaN/AlGaN based HEMTs. FIG. 2 shows a HEMT 30 that also had a source contact 13, a drain contact 14 and a Schottky gate 16 similar to those on the FET 10. It also has an $Al_xGa_{1-x}N$ semiconductor barrier layer 38 on a high resistivity, non-conducting GaN layer 34. Both these layers are formed on an aluminum nitride buffer layer 12 and a substrate 11 similar to those in FIG. 1.

However, in this embodiment, the layer 38 has a wider bandgap than the GaN layer 34 and this discontinuity in energy band gaps results in a free charge transfer from the wide band gap to the lower band gap material. A charge accumulates at the interface between the two and creates a two dimensional electron gas (2DEG) 42 that allows current to flow between the source and drain contacts 13 and 14. The 2DEG has very high electron mobility which gives the HEMT a very high transconductance at high frequencies. The voltage applied to the gate 36 electrostatically controls the number of electrons in the 2DEG directly under the gate, and thus controls the total electron flow.

Both the new FET 10 and HEMT 30 also include a layer of dielectric material 22 and 44 on the surface of their respective barrier layers 18 and 38, in the barrier layer's access regions. The dielectric layer is preferably silicon nitride ($Si_xN_y$), with silicon being the source of the donor electrons. To be most effective a dielectric layer 22, 44 should meet the following four conditions. First, it should have a dopant that provides a high source of donor electrons. For silicon nitride, the layer should have a high percentage percentage of Si. Although the applicant does not wish to be bound by any theory of operation, it is presently believed that electrons from the layer fill surface traps such that they become neutral and do not capture barrier layer electrons during operation.

Second, the energy level of the dopant should be higher than the energy level in the trap and for optimal results, the energy should be higher than the energy level of the barrier layer's conduction band edge. It is believed that this reduces the possibility of an electron from the gate metal giving to the donor states and prevents the trapping and de-trapping at that energy level. The layer will also work if the dopant's energy level is slightly below the energy level in the barrier layer's conduction band, but the higher its energy the better.

Third, there should be little or no damage to the device's surface and the forming of the dielectric layer should not increase the surface damage. It is believed that surface damage can create more surface traps. Fourth, the bond between the coating and the surface of the conducting channel should be stable under stress. If the bond is unstable, it is believed that the layer may fail under actual device operation when subjected to the stress created by increases in the electron field, voltage or temperature.

Figure 3:
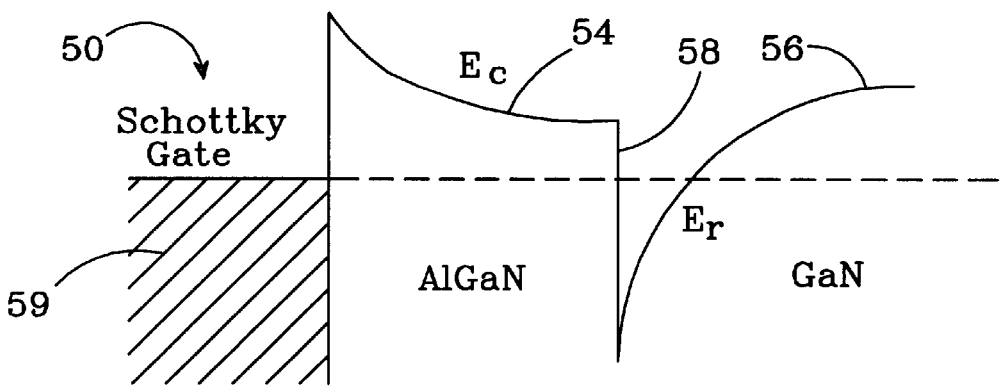
FIG. 3 is a band energy diagram for the new GaN/AlGaN HEMT, taken through its gate.

FIG. 3 shows a band diagram 50 for the new HEMT 30 taken at point 52 in FIG. 2, and vertically through the device's Schottky gate 16, barrier layer 38, 2DEG 42 and GaN layer 34. The diagram 50 shows the HEMT in equilibrium with no bias applied and no current flowing though the barrier layer. It shows the HEMT's barrier layer 54, GaN layer 56, and 2DEG 58 band energy. It is similar to a band diagram from the HEMT without a dielectric coating 44. The Schottky gate 59 covers the barrier layer below it, blocking the dielectric layer's electrons from reaching the barrier layer below it.

Figure 4:
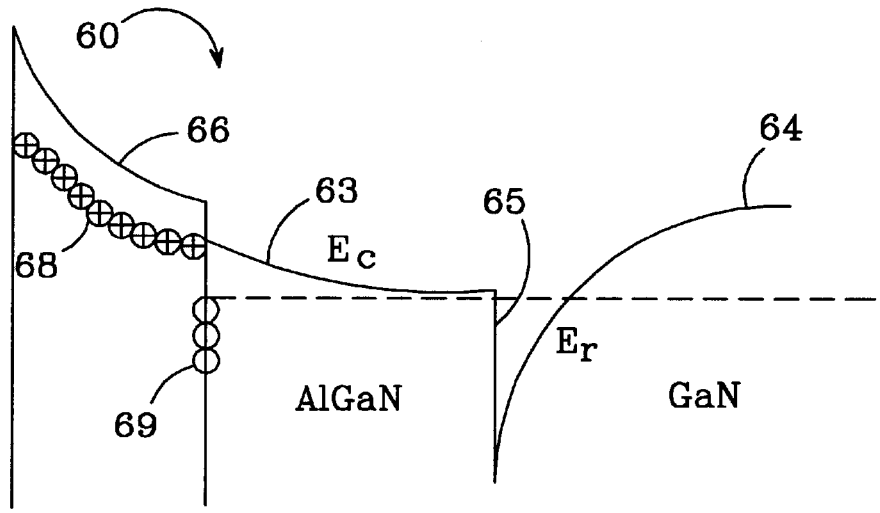
FIG. 4 is a band diagram of the new GaN/AlGaN HEMT, taken through one of its access regions.

FIG. 4 shows another band diagram 60 for the HEMT 30 (again at equilibrium) taken at point 62 in FIG. 2 and vertically through its dielectric layer 44, barrier layer 38, 2DEG 42 and GaN layer 34. The diagram again shows the HEMT's barrier layer 63, GaN layer 64 and 2DEG 65 band energy, and it shows the dielectric layer's band energy 66. In the barrier layer's access region there are typically surface traps 69 that reduce the frequency characteristics by trapping electrons. This diagram shows the dielectric layer's band energy 66 with a source of donor electrons 68 at a higher energy state than the traps 69. The electrons 68 migrate to the channel and fill the surface traps 69 causing then to become neutral and reducing their ability to capture electrons during operation.

Figure 5:
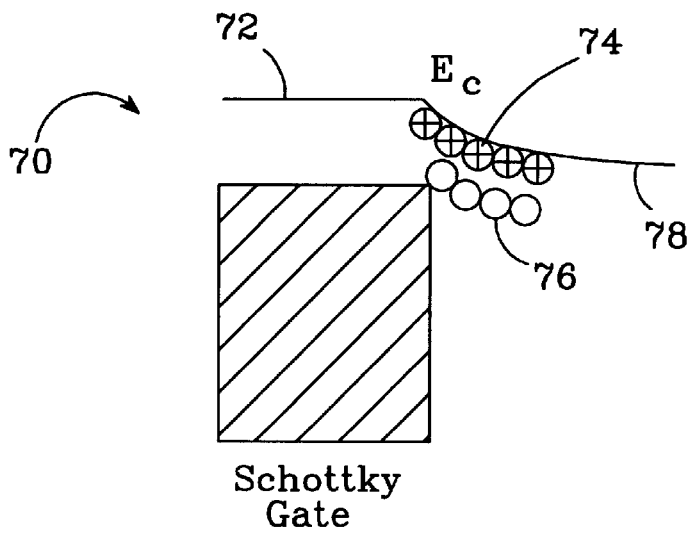
FIG. 5 is a band diagram of the new GaN HEMT, taken along the junction between the dielectric layer and the channel.

FIG. 5 shows a third band diagram 70 for the HEMT (at equilibrium) taken at point 71 in FIG. 2, and horizontally along the junction between the dielectric layer 44 and the barrier layer 38. It begins from the gate 16 and continues into the region between the gate and drain. At the gate there is no dielectric layer and the band energy 72 remains constant. Outside of the gate, at the barrier layer's access region, shallow donor electrons 74 from the dielectric layer are available to fill surface traps 76 causing them to become neutral. The band energy falls near the edge of the gate as the traps are filled and then levels off 78 in the access region.

Figure 6:
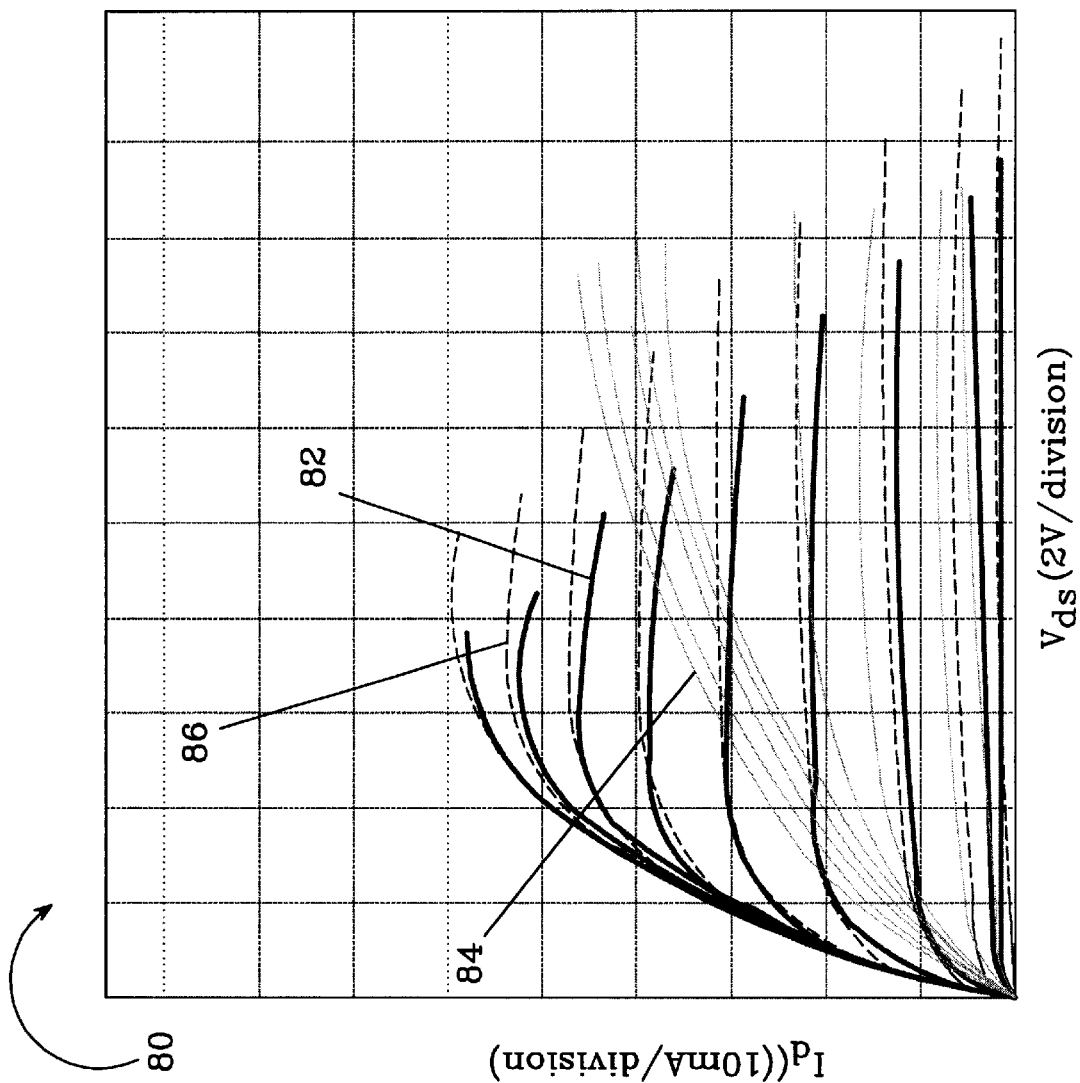
FIG. 6 is a set of graphs showing the output characteristics of the new GaN/AlGaN HEMT compared to one without the dielectric layer.

FIG. 6 shows the output characteristics 80 of the new HEMT with and without the dielectric layer. The gate sweep begins as a gate voltage of 2.0 volts followed by steps of 1 volt to generate the family of curves. The HEMT with or without the dielectric layer has the same DC high power output characteristics 82 (shown in bold lines). However, with AC gate drives applied to the device without the dielectric layer, the output response is significantly degraded 84 (normal lines). With the dielectric layer, the HEMT's AC output characteristics 86 (dashed lines) are nearly the same as its DC output characteristics 82, providing high power AC outputs.

Figure 7:
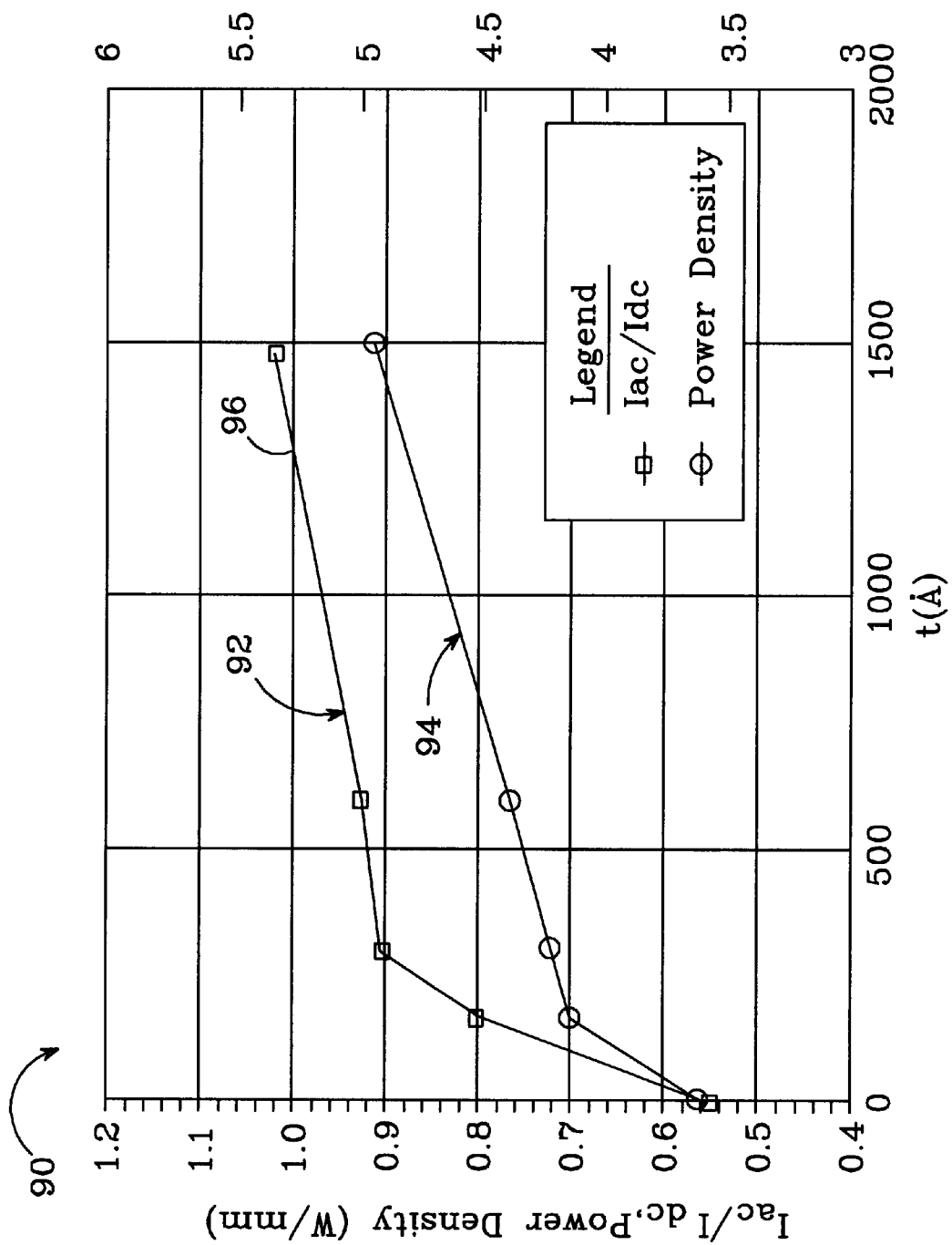
FIG. 7 is a set of graphs showing the difference in performance of the new HEMT as a function of the dielectric layer thickness.

FIG. 7 shows a graph 90 illustrating the drain current ratio (at $V_{ds}$=6V) under AC and DC drives ($I_{AC}/I_{DC}$) verses the thickness of the dielectric layer 92, and power density (at f=8 GHz, $V_{ds}$=20V) verses the thickness of a silicon nitride dielectric layer 94. As the thickness of the layer increases from 0 Å to the preferred thickness of approximately 1500 Å, the AC power density 94 increases. Around the preferred thickness, the graphs shows a point 96 where the AC power is approximately equal to the DC power density and the drain current ratio is approximately equal to one. At thicknesses less than 1500 Å the AC power density decreases and the current ratio is less than one. It is believed that this difference is caused by thinner layers not having a sufficient percentage of donor electrons to neutralize all the channel traps. This leaves a percentage of charged traps that are available to capture electrons during operation. However, if the layer is too thick, it will result in too much capacitance on the device's surface. At 1500 Å there is a sufficient percentage of donor electrons and any increase in the thickness does not appreciably improve the device's performance characteristics.

New Method of Manufacturing

As described above, the dielectric layer should have a strong bond with the surface of its FET and HEMT that is stable under stress. Various methods for depositing the layer can be used, including but not limited to sputtering, PECVD, MOCVD in situ at the of HEMT growth.

Figure 8:
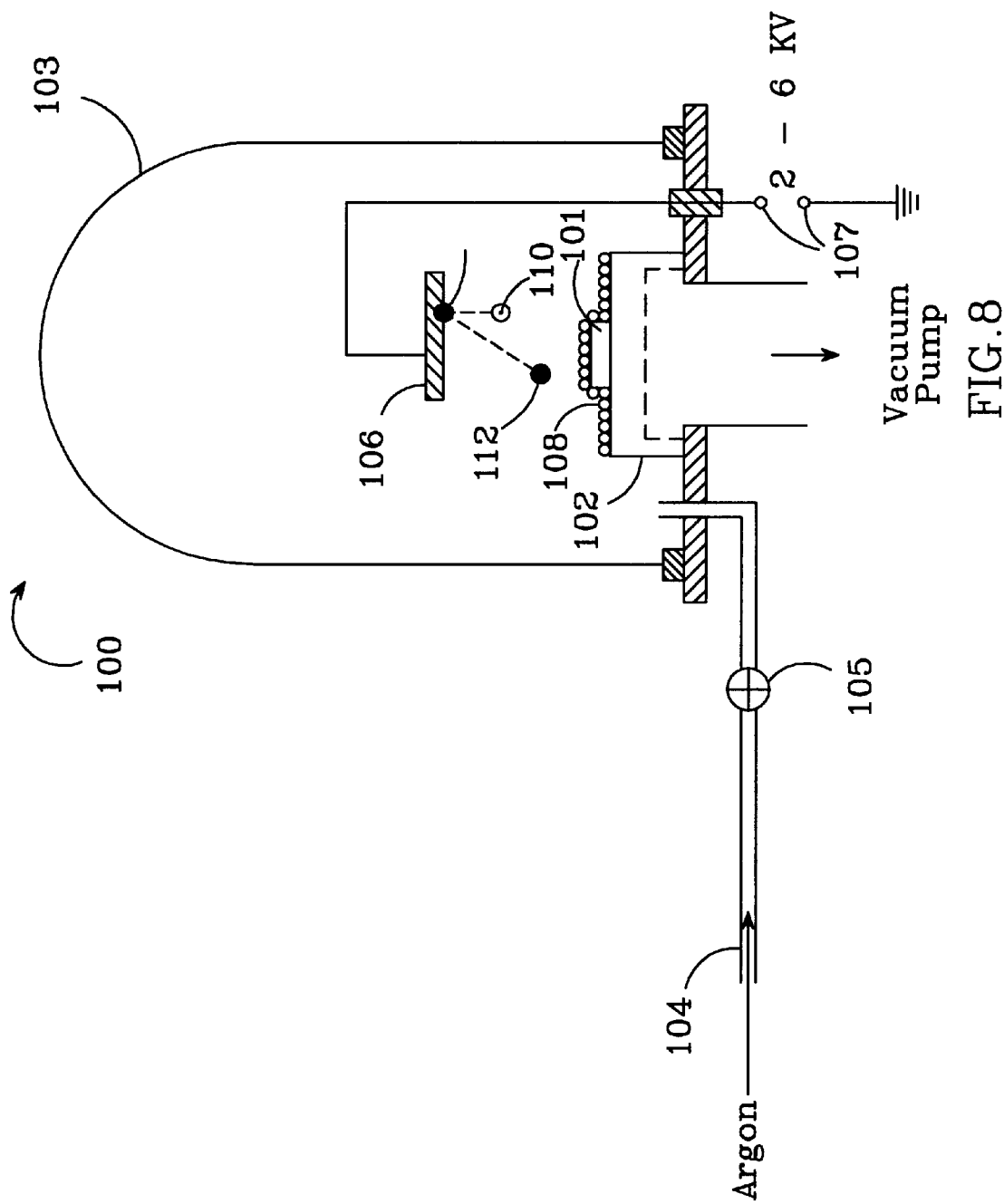
FIG. 8 is a sectional view of a conventional sputtering chamber.

The preferred method for depositing a layer 108 on the FET and HEMT having a strong bond that is also stable, is through sputtering. FIG. 8 shows a simplified sputtering chamber 100 that can be used to deposit material on a substrate. In operation, a semiconductor device 101 is placed on an anode 102. The chamber 103 is then evacuated and an inert gas 104 such as argon is bled through the valve 105 to maintain a background pressure. The cathode 106 is made of the material to be deposited on the substrate/device. With the application of a high voltage 107 between the electrodes, the inert gas is ionized and the positive ions 110 excel to the cathode 106. On striking the cathode 106, they collide with the cathode atoms 112, giving them sufficient energy to be ejected. The sputtered cathode atoms 112 travel through space, eventually coating the anode 102 and the semiconductor device 101, forming the layer 108. Other sputtering units can be more complex and detailed, but they work on much the same basic physical mechanisms. Using the more complex sputtering systems, it is possible to sputter and deposit a range of metals and dielectric layers.

Figure 9:
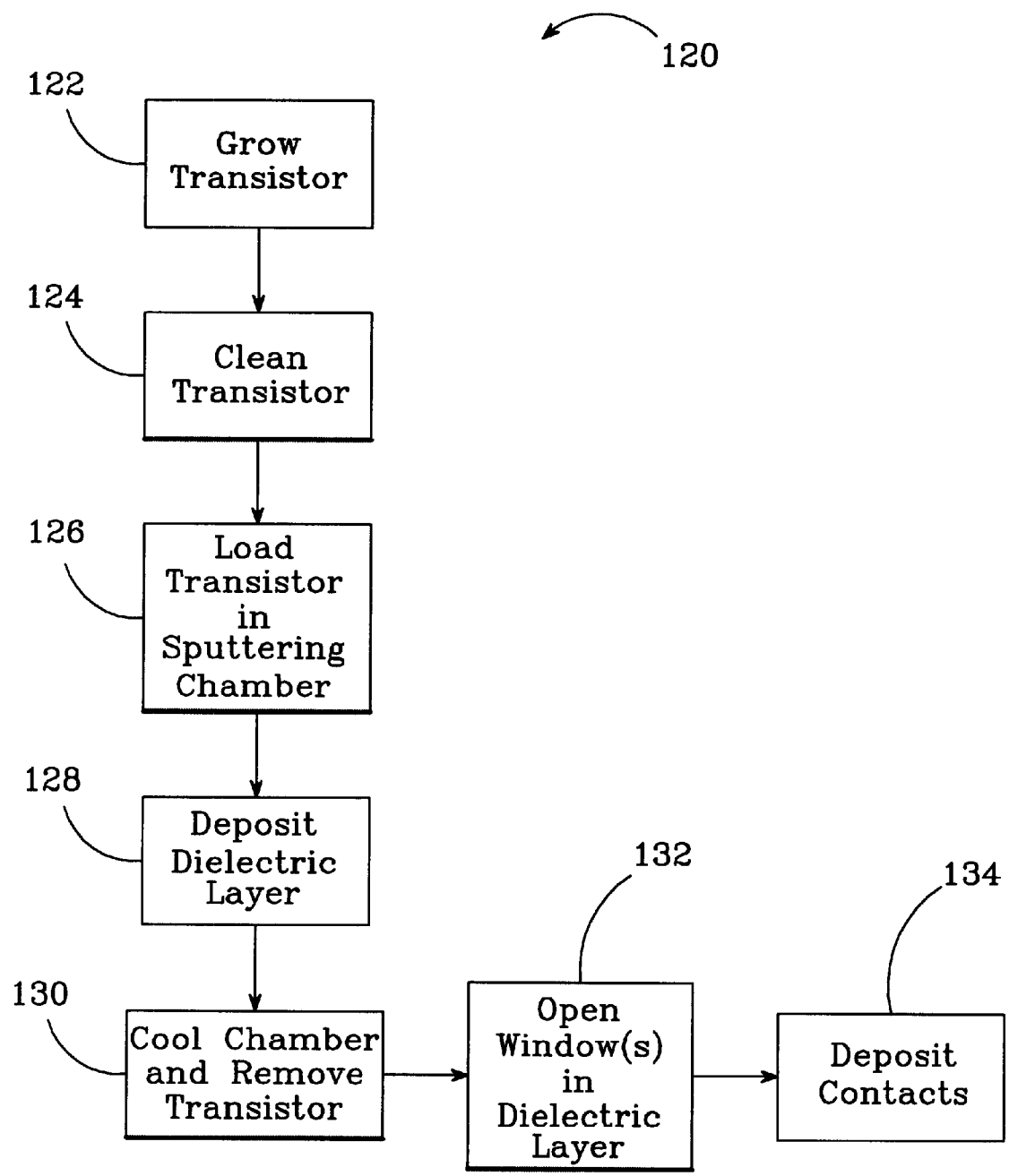
FIG. 9 is a flow diagram for the new method of producing a transistor with a dielectric layer.

FIG. 9 shows a flow diagram 120 for the new method of producing a transistor with a donor electron rich silicon nitride dielectric layer. The first step 122 is to form the device. The device is preferably an GaN/AlGaN FET or HEMT and it is preferably formed on a semiconductor wafer by a process such as metal-organic chemical vapor deposition (MOCVD). The wafer is then cleaned 124, with the preferred cleaning process being rinsing it with $NH_4OH$:$H_2O$ (1:4) for approximately 10 to 60 seconds. The wafer is then loaded into a sputtering chamber 126 having a silicon source.

In the next step 128, the Si$_x$N$_y$ dielectric layer is deposited on the wafer by sputtering. The preferred sputtering process includes the specific steps of pumping down the chamber to a low pressure of about 3×10$^{-7}$ Torr. Using a source gas having a flow of 20–100 sccm and a pressure of 5–10 mTorr the plasma is then started with RF power of 200–300W for about 2 minutes. This bombards the silicon at the cathode, cleaning its surface. The sputtering conditions are then changed such that the argon gas flow is 10–12 sccm, the nitrogen gas flow of 8–10 sccm, the chamber pressure of 2.5–5 mTorr, and the RF power of 200–300W. This condition is maintained for 2 minutes to sputter the Si cathode. The sputtered silicon reacts with the nitrogen and the resulting silicon nitride deposits on the wafer.

After sputtering, the next step 130 is to turn off the nitrogen gas and turn up the argon gas flow to 20–100 sccm for 2 minutes to clean the Si surface. All gas and power are then turned off and the chamber is allowed to cool down for five minutes and vent. The device can then be removed from the sputtering chamber. In step 132, windows are etched in the device for contacts and gate. An additional step in the process could include depositing the contacts and gate on the device's surface and attaching leads 134. Alternatively, the contacts and gate could be deposited on the device before depositing the dielectric layer in the sputtering chamber. The dielectric layer over the contacts and gate could then be etched to allow for the connection of leads.

In embodiments using T-gates instead of conventional gates, there may be some difficulty fully covering the transistors surface. This is due to the shadowing that can occur when the top of the T blocks sputtered materials from reaching areas around the footprint of the T-gate. To ensure full coverage, the transistor can be loaded at an angle and rotated during sputtering deposition.

In any of the deposition methods, it is important that the environment be hydrogen free, particularly when sputtering. Hydrogen atoms diffuse into the semiconductor material, where they can neutralize dopants. This can leave the dopants inactive, resulting in the material becoming insulating or weakly doped in its as grown state. This can result in critical performance problems for the new FET or HEMT.

Although the present invention has been described in considerable detail with reference to certain preferred configurations thereof, other versions are possible. Therefore, the spirit and scope of the appended claims should not be limited to the preferred versions described in the specification.

We claim:

1. A field effect transistor (FET), comprising:
   a high resistivity, non-conducting layer;
   a barrier layer on said non-conducting layer;
   respective source, drain and gate contacts contacting said barrier layer, with part of the surface of said barrier layer uncovered by said contacts; and
   an electron source layer formed on the surface of said barrier layer between said contacts, said electron source layer having a high percentage of donor electrons, said donor electrons allowing said transistor to produce efficient gain at microwave frequencies.

2. The FET of claim 1, wherein said channel has positive charged surface traps and wherein said donor electrons neutralize said traps.

3. The FET of claim 2, wherein said donor electrons have a higher energy state than said traps.

4. The FET of claim 1, wherein said electron source layer is a layer of dielectric material.

5. The FET of claim 1, wherein said electron source layer has a stable bond with said channel under stresses created by increase electron fields, voltage or temperature.

6. The FET of claim 1, wherein the surface of said channel is substantially free of damage.

7. The FET of claim 1, wherein the forming of said electron source layer causes substantially no damage to the surface of said barrier layer.

8. The FET of claim 1, wherein said electron source layer comprises silicon nitride.

9. The FET of claim 1, further comprising a substrate of sapphire or silicon carbide, said substrate being adjacent to said non-conducting layer, opposite said barrier layer.

10. The FET of claim 9, wherein said substrate is formed of a 4H polytype of silicon carbide.

11. The FET of claim 9, further comprising a buffer layer between said non-conducting layer and said substrate.

12. The FET of claim 11, wherein said buffer layer is made of Al$_x$Ga$_{1-x}$N, x being between 0 and 1.

13. The FET of claim 1, wherein said non-conducting layer and said barrier layer are made of Group III nitride semiconductor materials.

14. The FET of claim 1, wherein said barrier layer is made of Al$_x$Ga$_{1-x}$N.

15. The FET of claim 1, wherein said barrier layer is made of AlGaN and said non-conducting layer is made of GaN.

16. The FET of claim 1, wherein said source and drain contacts comprise an alloy of titanium, aluminum, and nickel.

17. The FET of claim 1, wherein said gate is selected from a group consisting of titanium, platinum, chromium, alloys of titanium and tungsten, and platinum silicide.

18. The FET of claim 1, wherein said channel has a wider energy bandgap than said non-conducting layer, said FET further comprising a 2 dimensional electron gas (2DEG) between said channel and non-conducting layer.

19. A high electron mobility transistor (HEMT), comprising:
   a high resistivity, non-conducting semiconductor layer;
   a barrier layer on said high resistivity layer, said barrier layer having a wider bandgap than said high resistivity layer;
   a two dimensional electron gas between said barrier layer and said high resistivity layer;
   respective source, drain and gate contacts contacting said barrier layer, with part of the surface of said barrier layer uncovered by said contacts; and
   an electron source layer formed on the surface of said conductive channel between said contacts, said layer having a high percentage of donor electrons, said barrier layer having positively charged traps, said donor electrons neutralizing said traps to allow said HEMT to produce efficient gain at microwave frequencies.

20. The HEMT of claim 19, wherein said barrier layer has positive charged traps and wherein said donor electrons neutralize said traps.

21. The HEMT of claim 20, wherein donor electrons have a higher energy state than said traps.

22. The HEMT of claim 19, wherein said electron source layer is a dielectric layer.

23. The HEMT of claim 19, wherein said electron source layer has a stable bond with said barrier layer under stresses created by increases in electron field, voltage or temperature.

24. The HEMT of claim 19, wherein the surface of said barrier layer is substantially free of damage.

25. The HEMT of claim 19, wherein said electron source layer comprises silicon nitride.

26. The HEMT of claim 19, further comprising a substrate of sapphire or silicon carbide, said substrate adjacent to said high resistivity layer, opposite said barrier layer.

27. The HEMT of claim 25, further comprising a buffer layer between said high resistivity layer and said substrate.

28. The HEMT of claim 19, wherein said high resistivity layer and said barrier layer are made of Group III nitride semiconductor materials.

29. The HEMT of claim 19, wherein said source and drain contacts comprise an alloy of titanium, aluminum, and nickel.

30. The HEMT of claim 19, wherein said gate is selected from a group consisting of titanium, platinum, chromium, alloys of titanium and tungsten, and platinum silicide.

31. A method for manufacturing a transistor with an electron source layer on its surface, comprising:

placing said transistor in a sputtering chamber,;

sputtering said electron source layer on said transistor in said sputtering chamber, said electron source layer providing a source of electrons to eliminate trapping and allow said transistor to provide efficient gain with AC signals applied to said gate contact;

cooling and venting said sputtering chamber; and removing said transistor from said sputtering chamber.

32. The method of claim 31, wherein said electron source layer is a dielectric layer with a high percentage of donor electrons.

33. The method of claim 31, further comprising forming said transistor and cleaning said transistor prior to placing said transistor in said sputtering chamber.

34. The method of claim 33, wherein said transistor is grown by metal-organic chemical vapor deposition (MOCVD).

35. A method for manufacturing a transistor with an electron source layer on its surface, comprising:

forming said transistor and cleaning said transistor prior to placing said transistor in said sputtering chamber, wherein said transistor is cleaned by rinsing said transistor with $NH_4OH:H_2O$ (1:4) for approximately 10 to 60 seconds placing said transistor in a sputtering chamber;

sputtering said electron source layer on said transistor in said sputtering chamber;

cooling and venting said sputtering chamber; and removing said transistor from said sputtering chamber.

36. The method of claim 31, further comprising opening windows in said electron source layer for contacts on said transistor after said transistor is removed from said chamber.

37. The method of claim 36, wherein said windows are opened in said electron source layer by etching.

38. The method of claim 31, wherein said transistor is a FET or a HEMT.

39. The method of claim 31, wherein said electron source layer is silicon nitride and said layer is deposited on said transistor by pumping down the said chamber to a predetermined pressure, bombarding a silicon source with a source gas to clean its surface, changing the chamber conditions to sputter the silicon, and allowing the sputtered silicon to react with nitrogen to deposit a silicon nitride layer on said transistor.

40. The method of claim 31, wherein the forming of said electron source layer causes substantially no damage to the surface of said transistor.

41. The method of claim 31, wherein said transistor is formed in a substantially hydrogen free environment.

* * * * *